United States Patent
Hagen

(10) Patent No.: US 7,443,244 B2
(45) Date of Patent: Oct. 28, 2008

(54) METHOD AND APPARATUS FOR CONTROLLING A POWER AMPLIFIER SUPPLY VOLTAGE

(75) Inventor: Rodney Hagen, Lake in the Hills, IL (US)

(73) Assignee: Motorola, Inc., Schaumburg, IL (US)

( * ) Notice: Subject to any disclaimer, the term of this patent is extended or adjusted under 35 U.S.C. 154(b) by 166 days.

(21) Appl. No.: 11/182,043

(22) Filed: Jul. 14, 2005

(65) Prior Publication Data

US 2007/0024372 A1 Feb. 1, 2007

(51) Int. Cl.
*H03G 3/10* (2006.01)
*H03F 3/04* (2006.01)

(52) U.S. Cl. ..................... 330/285; 330/297

(58) Field of Classification Search ............ None
See application file for complete search history.

(56) References Cited

U.S. PATENT DOCUMENTS

| | | | | |
|---|---|---|---|---|
| 5,774,013 | A * | 6/1998 | Groe | 327/543 |
| 6,842,067 | B2 * | 1/2005 | Andrys et al. | 327/539 |
| 7,196,584 | B2 * | 3/2007 | Harris | 330/296 |
| 2003/0045238 | A1 | 3/2003 | Leizerovich et al. | |

* cited by examiner

*Primary Examiner*—Robert J. Pascal
*Assistant Examiner*—Krista M Flanagan
(74) *Attorney, Agent, or Firm*—Valerie M. Davis

(57) ABSTRACT

A method for controlling a supply voltage for a radio frequency power amplifier, that includes the steps of: determining (210) at least one parameter; determining (220) a constant voltage based on the at least one parameter; and automatically adjusting (230) the supply voltage to the constant voltage.

19 Claims, 14 Drawing Sheets

METHOD AND APPARATUS FOR CONTROLLING A POWER AMPLIFIER SUPPLY VOLTAGE

FIELD OF THE INVENTION

The present invention relates generally to radio frequency (RF) power amplifiers (PAs) and more particularly to automatically adjusting the supply voltage of an RFPA to a constant voltage based upon one or more parameters.

BACKGROUND OF THE INVENTION

Energy efficient RF PAs are critical for achieving longer battery life and lower energy costs in state-of-the-art radio transceivers because typically they determine and dominate the power consumption of the system. One source of inefficiency in the PA operation is where the PA (or a PA stage if it is a multi-stage PA) operates using excessive and unneeded "headroom" or unneeded peak power capability. This may occur, for instance, when a linear PA is used in a non-linear application. When a PA is operating under such inefficient conditions, it would be desirable to adjust the supply voltage of the PA in order to reduce its drain potential and, thereby, reduce this unneeded headroom.

Thus, there exists a need for a method and apparatus to automatically adjust the power supply voltage of a PA to a constant voltage to reduce excess headroom in its operation. It is further desirable that the method and apparatus be usable for a wide range of modulation schemes and for a wide range of bandwidths of signals being transmitted using those modulation schemes.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

DETAILED DESCRIPTION OF THE INVENTION

Figure 1:
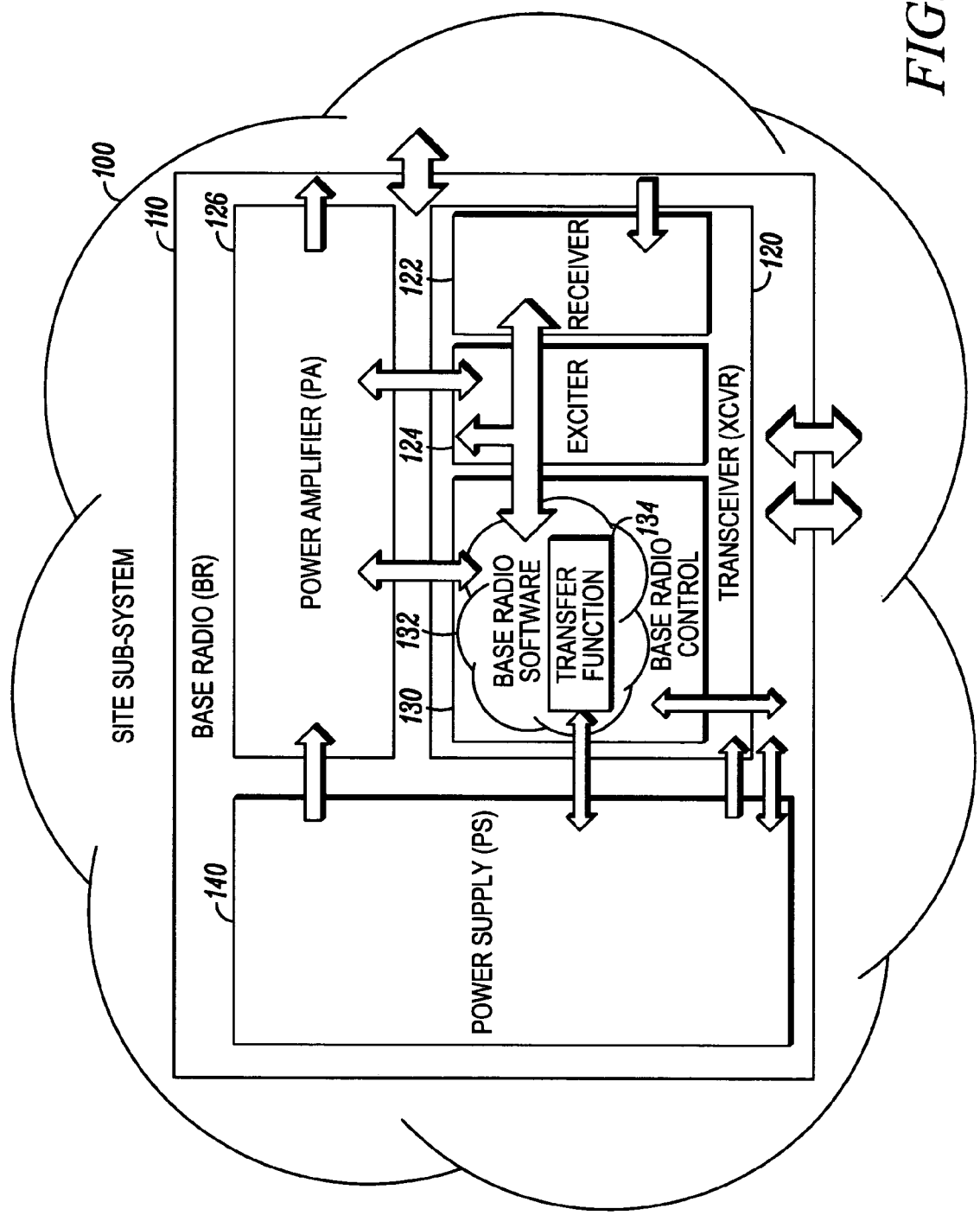
FIG. 1 illustrates a block diagram of a system that includes apparatus in accordance with embodiments of the present invention.

Before describing in detail embodiments that are in accordance with the present invention, it should be observed that the embodiments reside primarily in combinations of method steps and apparatus components related to a method and apparatus for controlling the supply voltage of a power amplifier. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein. Thus, it will be appreciated that for simplicity and clarity of illustration, common and well-understood elements that are useful or necessary in a commercially feasible embodiment may not be depicted in order to facilitate a less obstructed view of these various embodiments.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

It will be appreciated that embodiments of the invention described herein may be comprised of one or more conventional processors and unique stored program instructions that control the one or more processors to implement, in conjunction with certain non-processor circuits, some, most, or all of the functions of the method and apparatus for controlling the supply voltage of a power amplifier described herein. The non-processor circuits may include, but are not limited to, a radio receiver, a radio transmitter, signal drivers, clock circuits, power source circuits, and user input devices. As such, these functions may be interpreted as steps of a method to perform controlling of the supply voltage of a power amplifier described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used. Thus, methods and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

Generally speaking, pursuant to the various embodiments, a method and apparatus for automatically adjusting the supply voltage of a PA is described. The PA may be a single or multi-stage PA. If a multi-stage PA then the supply voltage adjustments may be provided at the final stage or at additional stages of the PA. The apparatus may in some embodiments include feedback circuitry but not in other embodiments. The adjustments may be enabled by a predetermined function implemented in software, hardware or a combination thereof. Moreover, when referring to any software implementation described herein, it should be understood by those skilled in the art that the embodiments described in the teachings herein may likewise be implemented in firmware without departing from these teachings. If enabled by a predetermined function, then the adjustments may be based on a power ratio that, for example, corresponds to a modulation scheme used in the base radio and may further be based on detecting the peak power of the PA using a suitable detection methodology and circuitry. Moreover, the adjustments may, alternatively or in combination, be based on detecting a compression level of the PA.

Pursuant to the various embodiments, the technique for adjusting the supply voltage is "non-envelop following" or "non-envelop tracking" meaning that the supply voltage of the PA is adjusted to a constant voltage that supports the maximum expected peak power for a given modulation signal instead of being adjusted to follow or track the signal waveform of the modulated signal being transmitted using the PA. This is converse to envelop following or envelop tracking techniques that follow or track the transmitted signal waveform by enabling the drain voltage (of the transistor in the PA that is used to amplify the modulated signal) to track or follow the envelop of the modulated signal. Therefore, an exemplary advantage is that the techniques described herein are not bandwidth dependent in that they can be applied regardless of the bandwidth of the modulated signal being transmitted. Those skilled in the art will realize that the above recognized advantages and other advantages described herein are merely exemplary and are not meant to be a complete rendering of all of the advantages of the various embodiments of the present invention.

Referring now to the drawings, and in particular FIG. 1, a system that includes apparatus in accordance with embodiments described herein is shown and indicated generally at 100. In this illustration, system 100 is a base cell site sub-system for enabling communications between a plurality of radios, for example, portable and mobile radios. System 100 comprises one or more base radios 110 also referred to in the art as a base station, a base transceiver station or a BTS, which may transmit and receive calls from the portable and mobile radios over communication resources that comprise any of the available resources, for example, RF technologies, including, but not limited to Code Division Multiple Access (CDMA), Time Division Multiple Access (TDMA), Frequency Division Multiple Access (FDMA), and the like. System 100 may further comprise elements (not shown in FIG. 1 so as not to obscure the embodiments described herein) including for example a radio frequency distribution system having one or more combiners and receiver multi-couplers, one or more routers through which a pair of cell site sub-systems may communicate, and one or more site controllers. These additional elements are well known in the art and will not be discussed herein in detail for the sake of brevity.

Turning again to base radio 110, base radio 110 comprises a transceiver 120 that includes a receiver 122 for receiving RF signals (from mobile radios for instance) and a transmitter that includes an exciter 124 coupled to a power amplifier 126 for enabling RF signals to be transmitted (to mobile radios for instance) via one or more antennas (not shown). As is well known in the art, the exciter generates a low power RF signal according to a given modulation scheme that is then amplified by the PA. The PA may comprise a single stage having a single PA device or multiple PA devices coupled in parallel, wherein a PA device comprises a transistor that produces a gain. The PA may alternatively comprise multiple stages each having either a single PA device or multiple PA devices coupled in parallel. A PA or power amplifier as referred to herein denotes the entire amplification lineup including all of the PA stages and PA devices comprised therein.

Base radio 110 further comprises control apparatus 130 for controlling, for example, the transceiver elements described above and for controlling the processing of the RF signals transmitted and received by these elements. The control apparatus 130 may include, for instance, one or more processor(s) (not shown) and memory (not shown) for storing base radio software 132 (including a transfer function 134 and/or peak detection and compression detection software as described below in detail) that may be executed by the processor(s) for enabling functionality of the base radio in accordance with embodiments described herein. At least a portion of the functionality of the control apparatus 130 may alternatively be implemented in suitable hardware without departing from the teachings herein.

Base radio 110 also comprises a conventional power supply 140 and additional elements such as a converter device (not shown) that may be controlled in accordance with embodiments described herein to generate a suitable supply voltage for the PA. Power supply 140 functions as a voltage source, which may be for instance a direct current (DC) voltage source, for elements of the base radio such as the transceiver 120, including the power amplifier 126. As is well known in the art, power supply 140 is typically coupled to a battery (not shown) and/or to an alternating current (AC) power source (not shown) in the cell site sub-system 100 and also typically provides a DC power source to charge the battery in the site sub-system. Moreover, the base radio 110 is also typically coupled to a site controller in the site sub-system 100 to help control congestion and access to communication resources.

Figure 2:
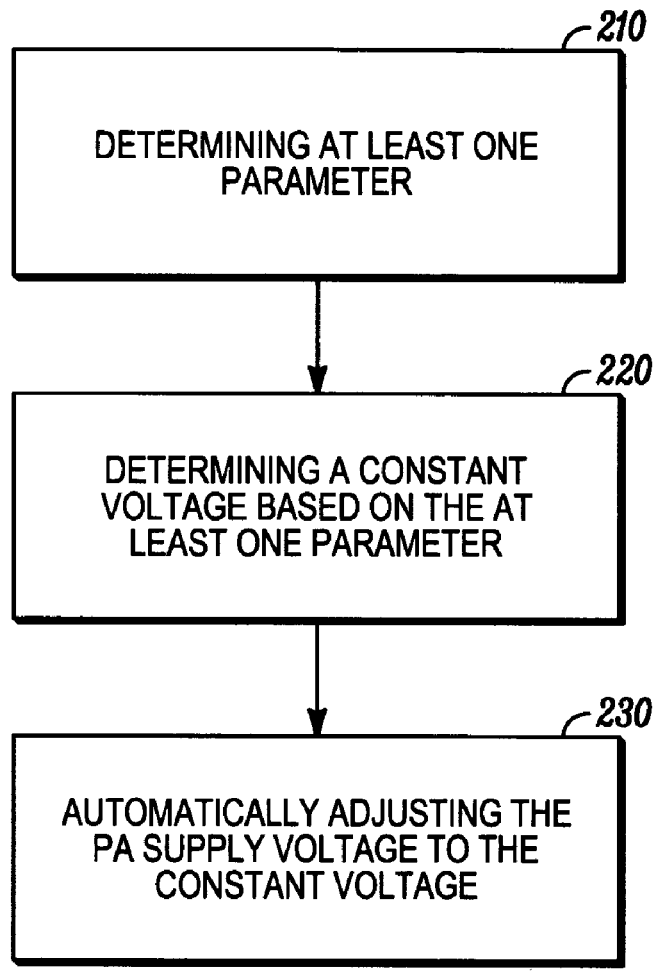
FIG. 2 illustrates a flow diagram of a method for adjusting the supply voltage of a power amplifier in accordance with embodiments of the present invention.

Turning now to FIG. 2, a flow diagram of a method for adjusting a supply voltage of a PA in accordance with embodiments described herein is shown and generally indicated at 200. Adjusting the supply voltage of the PA may include adjusting the supply voltage of a single PA device or of multiple PA devices in one or more stages of the PA. This method may be implemented, for example, at least in part in the control apparatus 130 of base radio 110. Method 200 comprises the steps of determining (210) at least one parameter; determining (220) a constant voltage based on the at least one parameter; and automatically adjusting (230) the PA supply voltage to the constant voltage.

As described in detail below, in some embodiments the at least one parameter may comprise a power ratio, for instance corresponding to a given modulation scheme, and the constant voltage may be calculated based on the power ratio by using a predetermined function. In other embodiments, the at least one parameter may comprise a compression level of the PA, e.g., the level of compression in a signal that is being transmitted, and the constant voltage may be determined based on the compression level. The method may comprise a loop from step 230 to step 210 for some embodiments, for example where the at least one parameter value(s) may change, thereby, necessitating re-determining the constant voltage and adjusting the PA supply voltage to the new constant voltage. Moreover, the constant voltage may be adjusted over time based on other non-envelop following parameters such as temperature or other environmental change.

Figure 3:
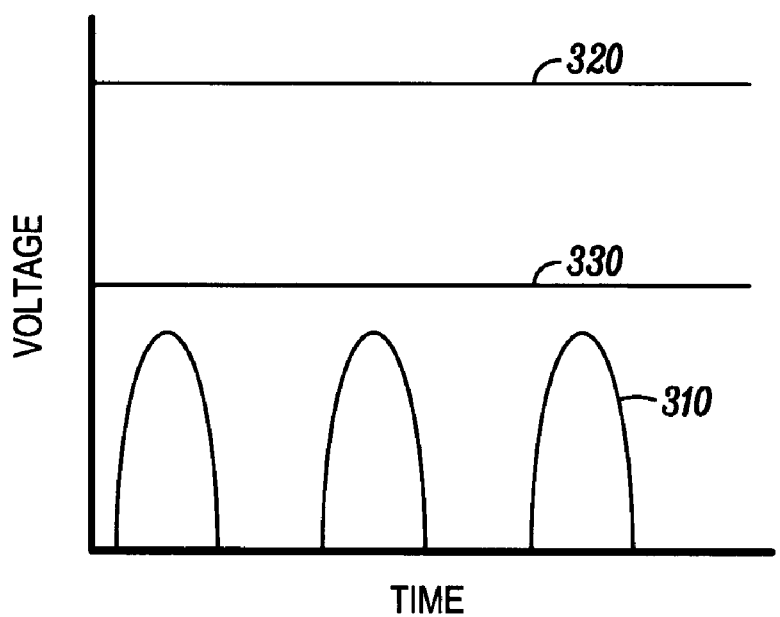
FIG. 3 illustrates a waveform diagram showing a supply voltage generated in accordance with embodiments of the present invention.

Turning now to FIG. 3, a waveform diagram is shown and generally indicated at 300 having a voltage axis and a time axis. The waveform diagram illustrates a waveform 310 corresponding to the drain (or collector) voltage of a transistor of a PA device used in amplifying a signal. An exemplary constant supply voltage adjusted in accordance with embodiments described herein is illustrated as a line 330. Line 320 represents an exemplary constant supply voltage provided to the PA device using known techniques, such as directly from the power supply. The voltage difference between 320 and 330 multiplied by the root-mean-square (RMS) current drawn by the PA device is substantially the power savings realized, where the actual power savings may depend on factors such as converter device efficiency, PA device sensitivity to drain (or collector) voltage changes, etc.

Figure 4:
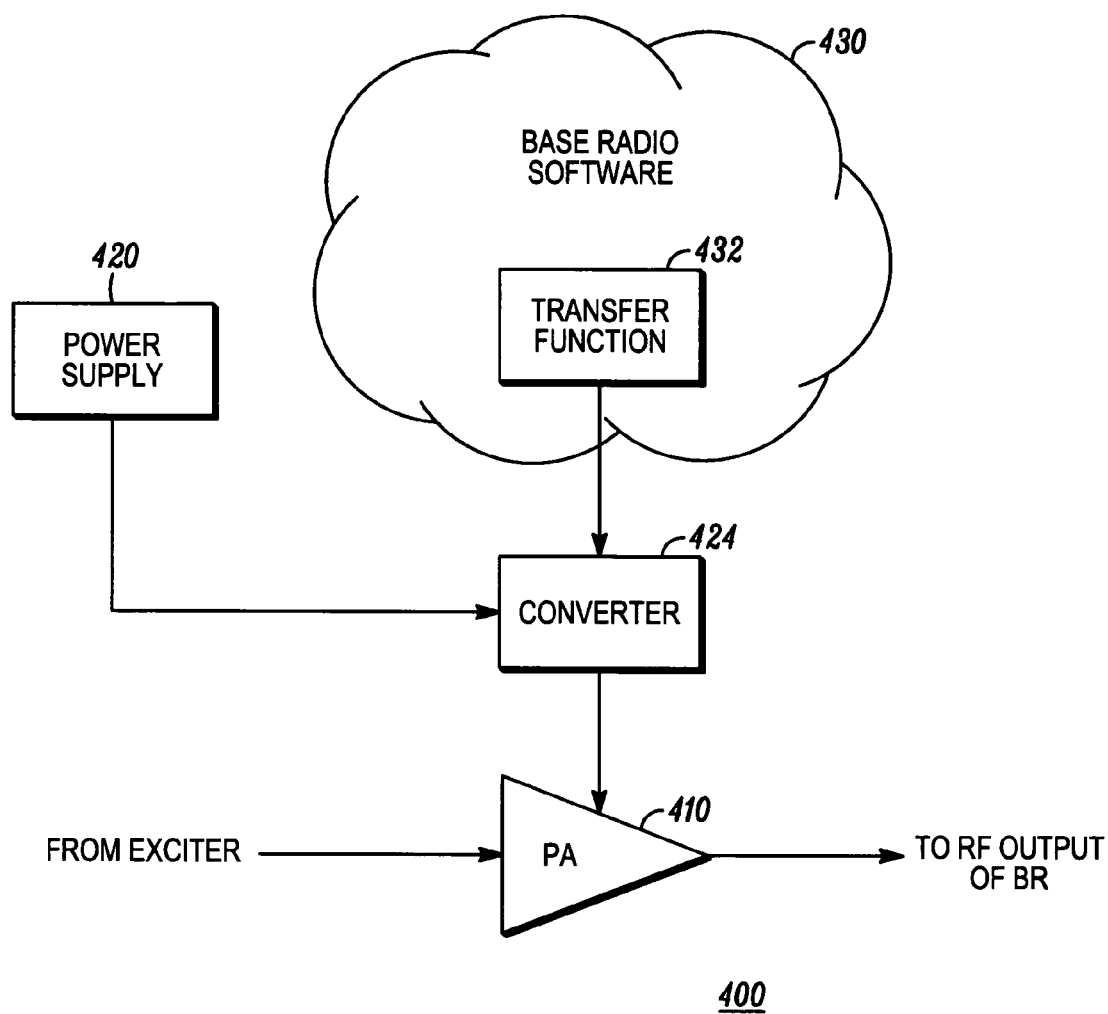
FIG. 4 illustrates a block diagram of apparatus in accordance with embodiments of the present invention.

Turning now to FIG. 4 exemplary apparatus in accordance with embodiments described herein is shown and generally indicated at 400. In this embodiment, apparatus 400 may be included in a base radio. Apparatus 400 comprises a RF PA 410 that may be a linear power amplifier or a non-linear power amplifier depending on the particular embodiment of the apparatus. In this illustration, PA 410 is shown as a single stage PA having a single PA device. However, the teachings herein may be applied to apparatus that includes a single stage PA having multiple PA devices or a multi-stage PA (each stage having one or more PA devices) without loss of generality, as illustrated by reference to FIGS. 6-9 and explained in detail below. PA 410 has associated with it a corresponding peak power capability, wherein operation of the PA at a power that exceeds its peak power capability may result in spectral non-compliance of the apparatus 400 and in a worst case may cause damage to the PA and resulting failure in apparatus 400. PA 410 is generally included as part of transceiver apparatus (not shown) of the base radio apparatus 400 and may be coupled to an exciter (not shown) to comprise a transmitter, as explained above, wherein the PA 410 receives a low power RF signal from the exciter that it amplifies to output an RF signal for transmission to and receipt by a mobile radio for instance. The transceiver apparatus also further generally comprises a receiver (not shown) as is well known in the art.

Apparatus 400 further comprises a power supply 420 that may provide a constant DC voltage source, wherein the value of the voltage supplied depends on the power requirements of the apparatus for given applications. Base radio apparatus 400 also includes a converter device 424 for converting an input voltage, e.g., the voltage provided by the power supply 420, into a voltage that may be used by other elements of apparatus 400 such as, for instance, PA 410. The voltage supplied to the PA 410 from the converter device 424 is referred to herein as the PA supply voltage or the supply voltage. Converter device 424 may comprise a device well known in the art such as, for instance, a buck converter. The buck converter typically receives a given voltage at its input and generates a lower voltage at its output. The particular topology of the buck converter may be designed to meet the design and power requirement specifications of the apparatus using principles well known in the art. Those of ordinary skill in the art will further realize that principles of the present invention are not limited to the use of a buck converter but may also encompass other converter types, such as a boost converter that converts a given input voltage to a higher voltage at its output, a flyback converter that converts a given input voltage to a higher or lower voltage at its output, etc.

Apparatus 400 further comprises a controller (not shown) that among other functions controls the transceiver of base radio apparatus 400 and in accordance with embodiments described herein may also control the PA supply voltage generated by the converter device 424. For example, the controller may comprise one or more processors and memory for storing software 430 for execution by the processor(s) for performing all or a portion of the controller functionality. Software 430 may include a predetermined transfer function 432 for controlling the PA supply voltage generated by the converter device 424. In embodiments described herein, the transfer function would receive a plurality of predefined inputs that may be constants and/or variables, for example as described below in detail, that may be used by the transfer function 432 to calculate a suitable PA supply voltage in accordance with embodiments described herein. It should be understood by those of ordinary skill in the art that in a different embodiment, the transfer function may be implemented in hardware, by using logic devices for instance, or any combination thereof. It should be further understood that software 430 includes additional software for use in controlling other base radio functionality.

Figure 5:
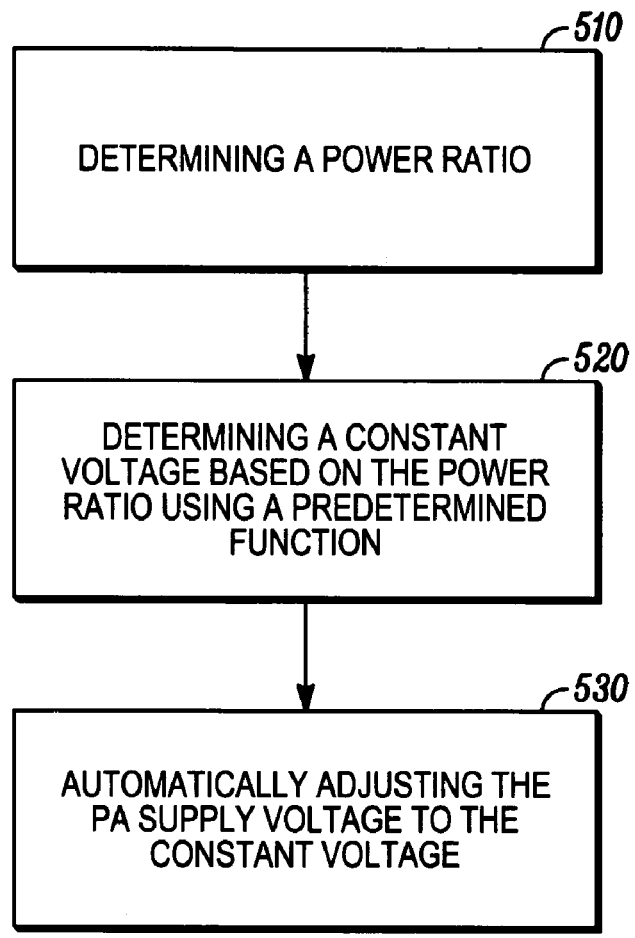
FIG. 5 illustrates a flow diagram of a method for adjusting the supply voltage of a power amplifier in accordance with embodiments of the present invention.

Turning now to FIG. 5, a flow diagram of a method for adjusting the PA supply voltage in accordance with embodiments described herein is shown and generally indicated at 500. Method 500 comprises the steps of: determining (510) a power ratio, wherein the power ratio is the percent utilization of the peak power capability of the PA, e.g., 410; determining (520) a constant voltage based on the power ratio using a predetermined function; and adjusting (530) the PA supply voltage to the constant voltage. Steps 510-530 may comprise a loop from step 530 to step 510 in some embodiments. Steps 510-530 will now be explained by reference to FIG. 6.

Figure 6:
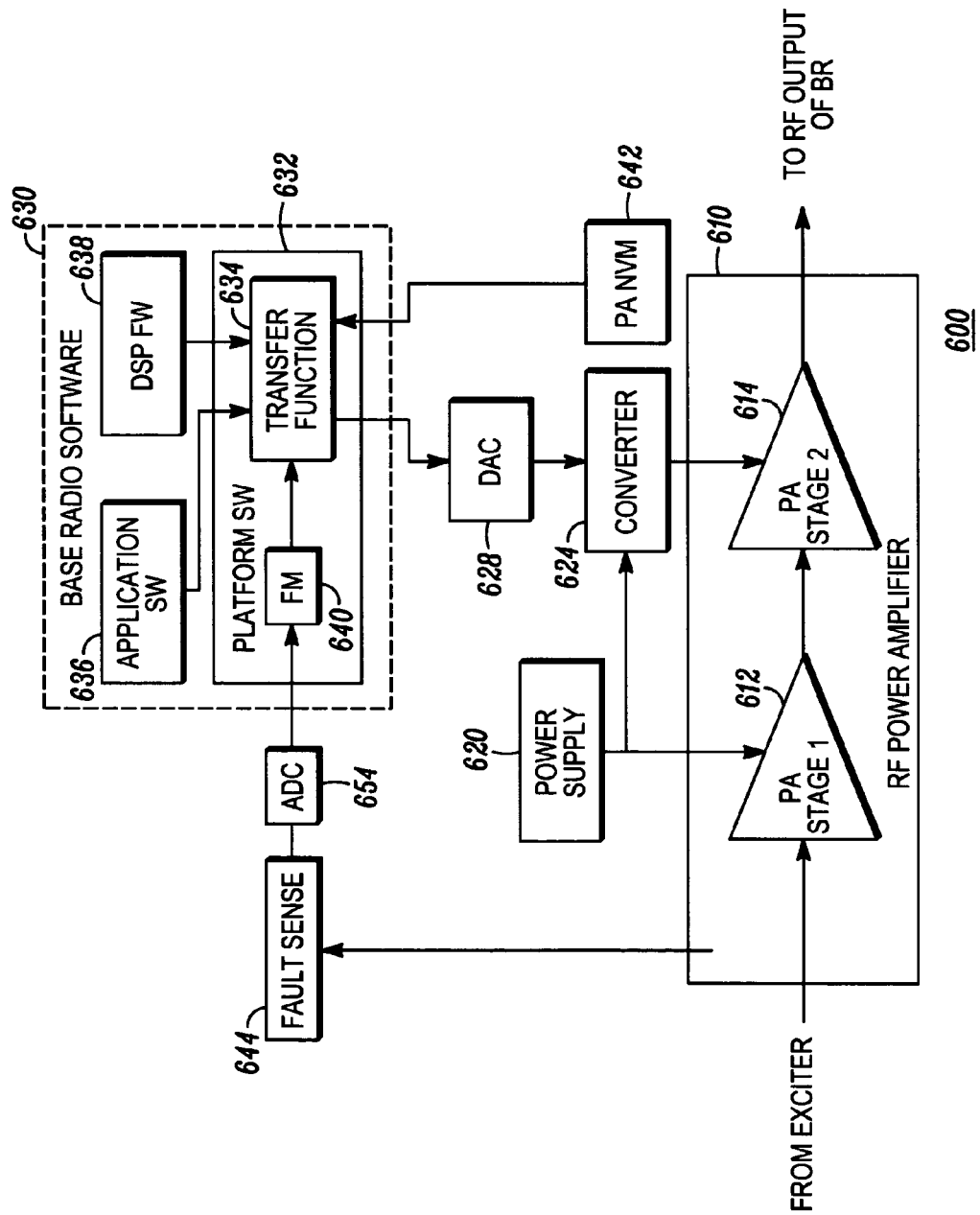
FIG. 6 illustrates a block diagram of apparatus in accordance with embodiments of the present invention.

Turning now to FIG. 6 exemplary apparatus in accordance with embodiments described herein is shown and generally indicated at 600. In this embodiment, apparatus 600 may be included in a base radio. Apparatus 600 comprises a RF PA 610 that may be a linear power amplifier or a non-linear power amplifier depending on the particular embodiment of the apparatus. In this illustration, PA 610 is shown as a multi-stage PA having a first stage 612 and a second stage 614, each stage comprising a single PA device. However, the teachings herein may be applied to apparatus that includes different amplification lineups as described above without loss of generality. PA 610 has associated with it at least one corresponding peak power capability, wherein operation of the PA at a power that exceeds its peak power capability may result in spectral non-compliance of the apparatus 400 and in a worst case may cause damage to the PA and resulting failure in apparatus 600. PA 610 is generally included as part of transceiver apparatus (not shown) of the base radio apparatus 600 and may be coupled to an exciter (not shown) to comprise a transmitter, as explained above, wherein the PA 610 receives a low power RF signal from the exciter that it amplifies to output an RF signal for transmission to and receipt by a mobile radio for instance. The transceiver apparatus also further generally comprises a receiver (not shown) as is well known in the art.

Apparatus 600 further comprises a power supply 620 that may provide a constant DC voltage source, wherein the value of the voltage supplied depends on the power requirements of the apparatus for given applications. Base radio apparatus 600 also includes a converter device 624 for converting an input voltage, e.g., the voltage provided by the power supply 620, into a voltage or voltages that may be used by other elements of apparatus 600 such as, for instance, PA 610. Converter device 624 may comprise a device well known in the art such as, for instance, a buck converter, a boost converter, a flyback converter, etc., the particular topology of which may be designed to meet the design and power requirement specifications of the apparatus, using principles well known in the art.

Apparatus 600 further comprises a controller (not shown) that among other functions controls a transceiver of base radio apparatus 600 and in accordance with embodiments described herein may also control the PA supply voltage generated by the converter device 624. For example, the controller may comprise one or more processor(s) and memory for storing software 630 for execution by the processor(s) for performing all or a portion of the controller functionality. Software 630 may include platform software 632 that facilitates communication between the hardware and the various software applications comprising software 630. Platform software 632 may include fault management software 640 (explained below in additional detail) and a predetermined transfer function 634 for controlling the PA supply voltage generated by the converter device 624. In embodiments described herein, the transfer function would receive a plurality of predefined inputs (that may be constants or variables), for example as described below in detail, that may be used by the transfer function 634 to calculate a suitable PA supply voltage in accordance with embodiments described herein. It should be understood by those of ordinary skill in the art that in a different embodiment, the transfer function may be implemented in hardware, by using logic devices for instance, or any combination thereof.

The transfer function 634 typically generates a digital word representative of the calculated PA supply voltage. Therefore, apparatus 600 would typically comprise a digital-to-analog converter (DAC) 628 to convert this digital word into an analog signal corresponding to the calculated PA supply voltage. The analog voltage may in one embodiment be representative of or correspond directly to the value of the calculated PA supply voltage. However in an alternative embodiment, the analog voltage provided to the converter 624 may be a scaled version of the calculated PA supply voltage, for example when the DAC has a maximum output that is less than the calculated PA supply voltage. In that instance, the calculated PA supply voltage may be scaled in software for instance by the maximum converter device output divided by the maximum DAC output and a digital word representative of the scaled calculated supply voltage would be provided to the DAC, which would provide the corresponding analog voltage signal to the converter device. The converter device would then convert the corresponding analog voltage back to the calculated PA supply voltage and provide it to the PA.

Returning to software 630, it may further comprise application software 636 and digital signal processing (DSP) firmware (FW) 638. The application software 636 may define one or more modulation schemes that may be implemented by apparatus 600 and may also provide for communications security functions and waveform requirements, for instance. Applications software 636 may also comprise a customer's requested or average power output for the PA, which may be based on the modulation scheme implemented by the radio apparatus. DSP firmware 638 provides for the digital signal processing functions of the one or more modulation schemes defined in the applications software 636 and may also provide the Peak-to-Average power Ratio (PAR) for each modulation scheme.

Apparatus 600 may further comprise non-volatile memory (NVM) 642 corresponding to the PA 610 for storing information or data regarding the PA including, for instance, the peak power capability of the PA. In some embodiments, apparatus 600 may also further comprise a fault sense circuit 644 to detect a failure in one or more of the PA devices (such as a failure in the PA device transistor) comprising PA 610. Upon detecting the failure, fault sense circuit 644 may provide an indication to fault management software 640, for instance as described below, to enable the fault management software to affect the PA supply voltage. In embodiments where the PA has one or more stages having a plurality of PA devices in parallel (such as the final stage of a PA), the fault sense circuit may be operatively coupled to each PA device, in that stage, so that the fault sense circuit can detect and indicate a failure in any one or more of those PA devices.

In one exemplary embodiment, the fault sense circuit 644 may include, for example, a final amplifier device(s) failure sensor and a temperature sense circuit. In accordance with one embodiment of the final amplifier device(s) failure sensor, the sensor could measure the gate (or base) voltage of the PA device(s) in the final stage of the PA. The measurement could be an analog voltage signal(s) that is provided to an analog-to-digital converter (ADC) 654 that provides a digital word to enable a microprocessor to execute the fault management software 640 to compare the sensed voltage(s) to a threshold stored in software to make a failure determination. In one exemplary embodiment, the temperature sense circuit may comprise a resistive divider with one leg of the divider being a thermistor. This divider could in turn provide an analog voltage signal (that corresponds to temperature) to an ADC 654 that provides a digital word to enable a microprocessor to execute the fault management software to compare the sensed voltage to a threshold stored in software to make an over or above temperature fault determination.

In operation, the PA 610 receives a low power RF signal from the exciter at the first stage 612 of the PA, which is amplified by PA 610 and the resultant amplified signal output from the second stage 614 of the PA. The converter device 624 adjusts the PA supply voltage to an appropriate constant level to effectively transmit the amplified signal while minimizing power losses in the PA and while still maintaining spectral compliance. The transfer function used to control the PA supply voltage provided by the converter device can be determined as follows.

The power out, P, of a transistor of a PA can be defined by its drain potential, V, and its output impedance, R, by the equation, $$V^2/R = P. \tag{1}$$

For two different powers out, $P_1$ and $P_2$, for a given output impedance, R, the drain potential of the power transistor will vary as reflected in the equation, $$(V_1^2/R)/(V_2^2/R) = P_1/P_2. \tag{2}$$

The Rs may cancel because the Rs typically remain substantially similar over controlled voltage swings, yielding the basic formula, $$(V_1/V_2)^2 = P_1/P_2 = P_R = \text{Power Ratio}. \tag{3}$$

The base formula to set the voltage potential of the PA (e.g., the PA supply voltage) becomes, $$V_1 = (P_R)^{1/2} * V_2, \tag{4}$$

Where $V_1$ is the output voltage of converter device 624 (e.g., the PA supply voltage), and $V_2$ is the input voltage of the converter device 624 e.g., the voltage from power supply 620. One or more scalars may be included in equation (4) to further adjust the output voltage of the converter device 624 based on additional parameters. For example a scalar, S, that is modulation independent may further be included in equation (4) to account for differences in the base radio apparatus that may be calibrated using the scalar, for instance in the factory where the base radio apparatus is manufactured. In addition, a scalar $S^M$ may be included in equation (4) that is modulation dependent. In such an embodiment, this scalar could be used, for instance, to yield greater efficiencies for non-linear modulation schemes. Including these scalars, equation (4) becomes.

$$V_1 = (P_R)^{1/2} * V_2 * S * S_M. \quad (5)$$

In accordance with this embodiment, let $P_1$ of $P_R$ be the peak requirement of the PA in Watts (e.g., $P_{Peak\ Req}(W)$), and let $P_2$ of $P_R$ be the peak power capability of the PA for a given $V_2$ (e.g., $P_{Peak\ Cap}(W)$). In this embodiment, $$P_{Peak\ Req}(W) = 0.001 * 10^{\wedge(P_{Peak\ Req}(dB)/10)}, \quad (6)$$

and $$P_{Peak\ Req}(dB) = P_{peak\ to\ Average\ Ratio}(dB) + P_{Avg}(dB), \quad (7)$$

wherein $P_{peak\ to\ Average\ Ratio}(dB)$ is the Peak-to-Average power ratio (PAR) based on the modulation scheme being used, and $P_{Avg}$, (dB) is the average power needed for a customer's application. Equation (5) then becomes, $$V_1 = ((0.001*10^{\wedge([P_{Peak\ to\ Average\ Ratio}(dB)+P_{Avg}(dB)]/10)})/P_{Peak\ Cap(W)})^{1/2} * V_2 * S * S_M, \quad (8)$$

wherein: the input $P_{Peak\ to\ Average\ Ratio}(dB)$ may be obtained from the DSP firmware 638; the input $P_{Avg}$ (dB) may be obtained from the application software 636; and the inputs $P_{Peak\ Cap}$, S and $S_M$ may be obtained from the PA NVM, in this embodiment. Thus, equation (8) may be used by the base radio apparatus 600 as the predetermined transfer function used to control the PA supply voltage generated by the converter device 624.

In this embodiment, the PA supply voltage generated as a result of executing equation (8) is applied only to the final stage 614 of PA 610. The first stage (612) of PA 610 receives the voltage from the power supply 620 as its supply voltage. However in other embodiments, for example as described below, the PA supply voltage generated may be provided to additional stages of the PA.

Although the PA supply voltage generated in accordance with the embodiments described herein (e.g., based on the transfer function 634 or based on compression detection techniques) would typically be provided to the PA during normal operation. There may be circumstances under which it may be desirable to perhaps override or disable this functionality to provide a different supply voltage, for example if there is a failure in the PA as sensed by fault sense circuit 644.

Suppose, for instance, fault sense circuit 644 and fault management software 640 detect and determine that the transistor of one of the PA devices in PA 610 has failed. This will likely reduce the peak power capability of the PA, thereby, making the PA supply voltage determined as a result of transfer function 634 less reliable since operating the PA using this supply voltage could yield spectral violations. In this situation, it may be desirable to increase the supply voltage above what it would be as a result of the transfer function. In one embodiment, a maximum PA supply voltage may be provided to the PA, for instance by providing to the PA substantially the voltage output by the power supply 620, taking into consideration ohmic (resistance) losses, for instance, inherent to the converter. This is referred to herein as operating the PA in "pass-through" mode. When an over temperature fault is detected and determined using the fault sense circuit 644 and fault management software 640, however, it may be desirable to operate the PA in accordance to the voltage calculated by the transfer function 634 because operating the PA in pass-through mode would likely further heat the PA.

This embodiment 600, and others described herein by reference to FIGS. 7-14, is especially advantageous for radio apparatus that is configured to operate in accordance with at least two modulation schemes because it enables the provision to the PA of an appropriate constant supply voltage corresponding to each modulation scheme that would reduce unneeded headroom when switching between the modulation schemes. However, those skilled in the art will realize that the principles described herein are also beneficial where the radio apparatus is configured to operate in accordance with a single modulation scheme so that headroom may be similarly reduced where a change in any of the variables or parameters being measured and detected would warrant a decrease in the PA supply voltage.

Figure 7:
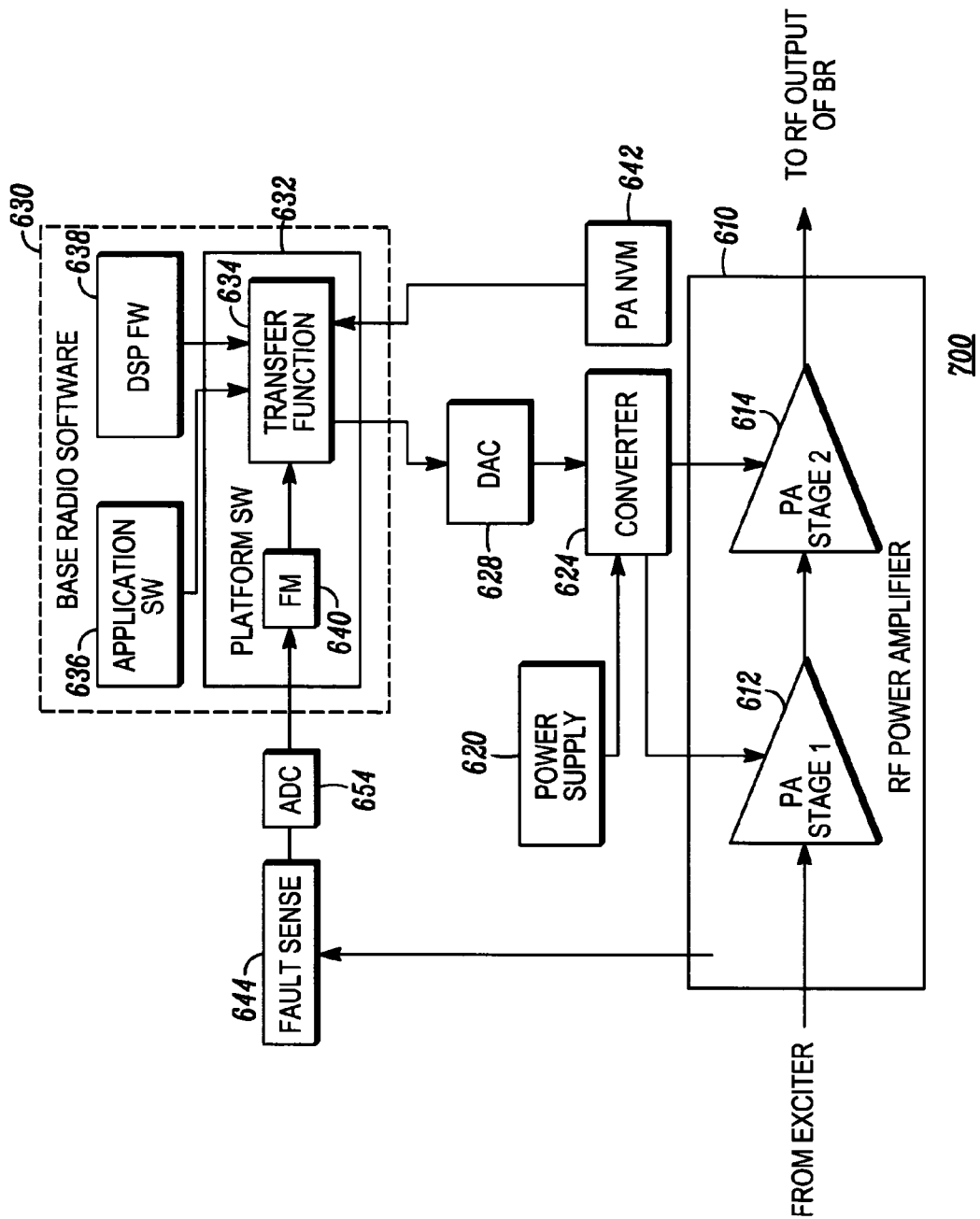
FIG. 7 illustrates a block diagram of apparatus in accordance with embodiments of the present invention.
Figure 8:
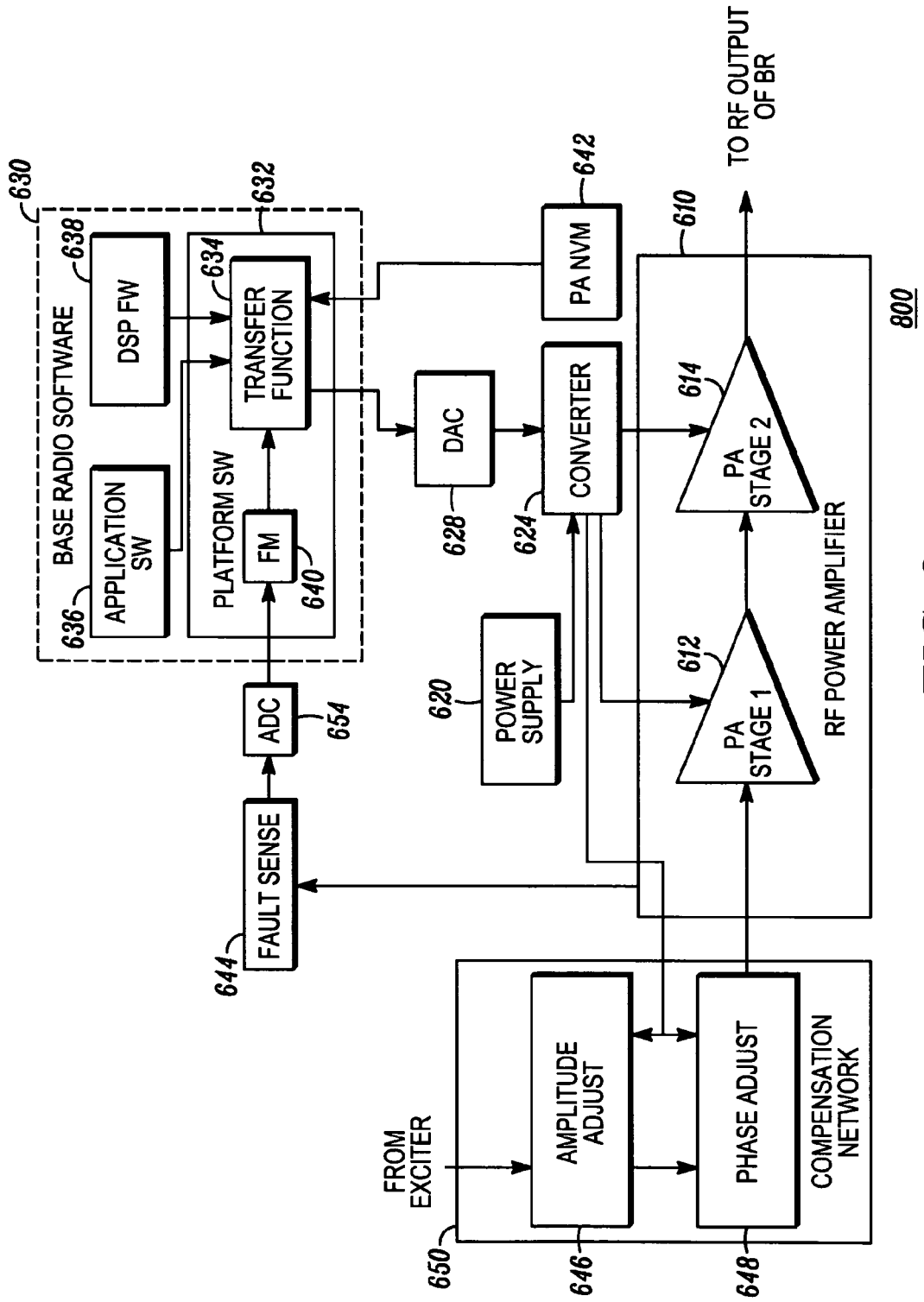
FIG. 8 illustrates a block diagram of apparatus in accordance with embodiments of the present invention.
Figure 9:
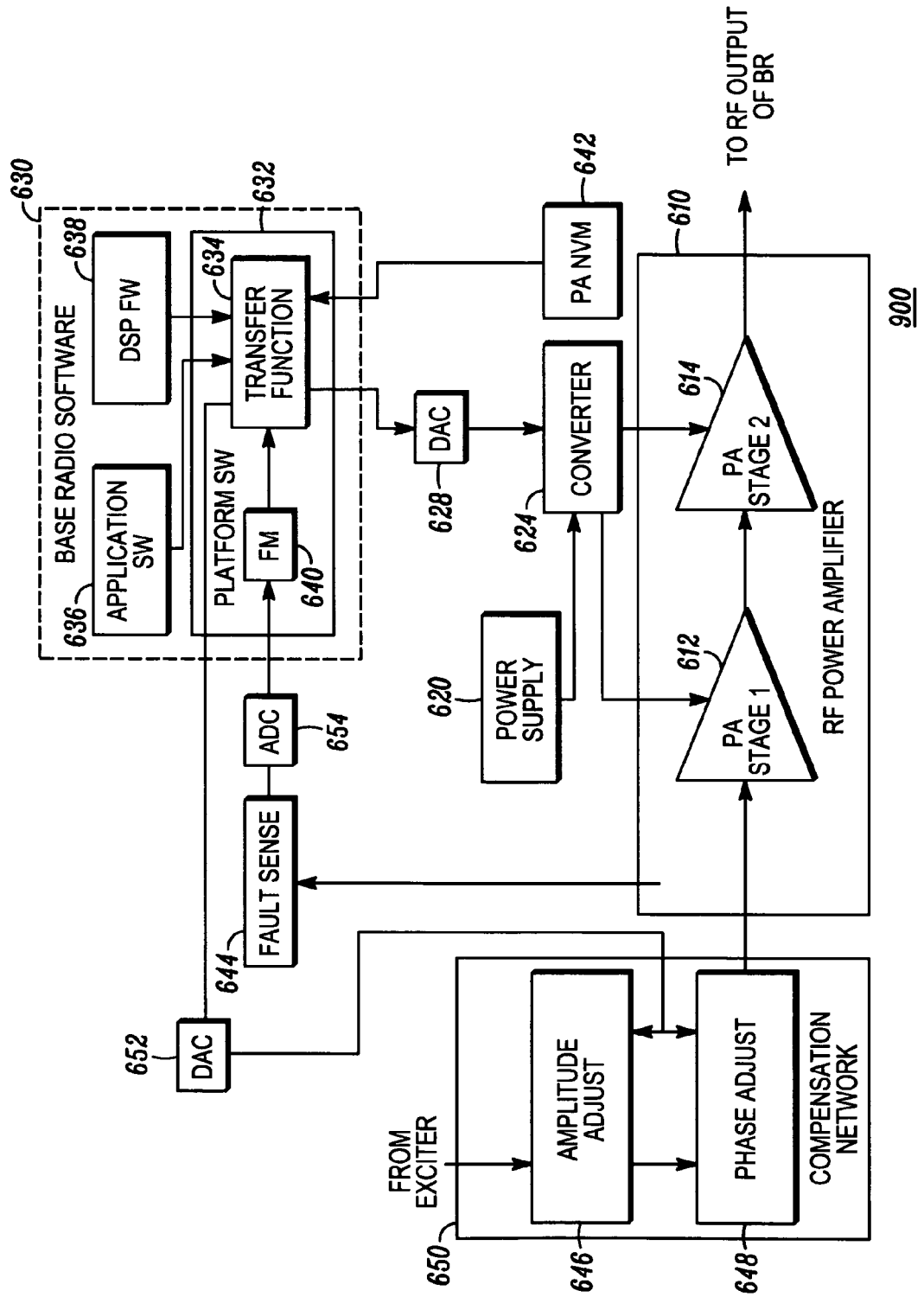
FIG. 9 illustrates a block diagram of apparatus in accordance with embodiments of the present invention.

FIGS. 7-9 illustrate additional embodiments wherein a predetermined transfer function is used to control the PA supply voltage. These embodiments may also implement equation (8) as an exemplary transfer function 634 in software, hardware or a combination thereof. Those elements in FIGS. 7-9 that are the same as or substantially similar to the corresponding elements in FIG. 6 will not be discussed in detail by reference to FIGS. 7-9 for the sake of brevity. These elements include: RF PA 610 comprising the first stage 612 and the second stage 614; power supply 620; converter device 624; a DAC 628; a controller that may comprise one or more processors and memory for storing software 630 for execution by the processor(s) for performing all or a portion of the controller functionality, wherein software 630 may include platform software 632 (having for example fault management software 640 and a predetermined transfer function 634), application software 636 and digital signal processing (DSP) firmware 638; PA NVM 642; fault sense circuit 644; and ADC 654. Additional elements, functionality, structure and connectivity that are included in any of FIGS. 7-9 and not included in FIG. 6 will, however, be described below.

In accordance with the embodiment 700 illustrated in FIG. 7, converter device 624 adjusts the supply voltage for both the first (612) and second (614) stages of PA 610. Accordingly, depending on the particular implementation and converter topology, the same supply voltage could be provided to each stage in one embodiment. Alternatively, in another embodiment the converter device 624 may provide a unique supply voltage to each stage, e.g., with respect to the other stages.

The embodiment 800 illustrated in FIG. 8 is similar to the embodiment illustrated in FIG. 7 in that converter device 624 adjusts the supply voltage for both the first (612) and second (614) stages of PA 610. The apparatus 800 illustrated in FIG. 8, however, also comprises a compensation circuit or network 650 to adjust the amplitude and/or the phase of the signal from the exciter to the first stage 612 of PA 610 to offset any phase and/or amplitude shifting of the signal from the PA output due to a voltage change from converter device 624. Compensation circuit 650 may comprise an amplitude adjustment circuit 646 receiving the signal from the exciter and adjusting the signal amplitude if necessary and a phase adjustment circuit 648 receiving the signal from the amplitude adjustment circuit and adjusting the phase of the signal if necessary. In this embodiment, both circuits 646 and 648 are controlled by converter device 624, for example, based on the PA supply voltage that it provides to PA 610 or a scaled version thereof.

The amplitude adjustment circuit 646 may comprise, for example, one or more pin diodes, and the phase adjustment circuit 648 may, for example, comprise one or more varactor diodes, all of which are well known in the art. Other embodiments of a compensation circuit 650 may be realized by those of ordinary skill in the art without departing from the principles taught herein. It should further be noted that a compensation circuit, such as is described above by reference to FIG. 8 may also be implemented in other embodiments using different amplification lineups as described above.

The embodiment 900 illustrated in FIG. 9 is similar to the embodiment illustrated in FIG. 8. The only difference is that the amplitude and phase adjustment circuits 646, 648 are directly controlled by software 630 in the base radio apparatus via a DAC 652 instead of through the converter device 624 as in the embodiment 800. In embodiment 900, circuits 646 and 648 may be directly controlled by the transfer function 634 by using the output of the transfer function, a scaled version thereof or by using the output of the transfer function as the input of a second transfer function whose output provides a suitable input to the compensation circuit.

Figure 10:
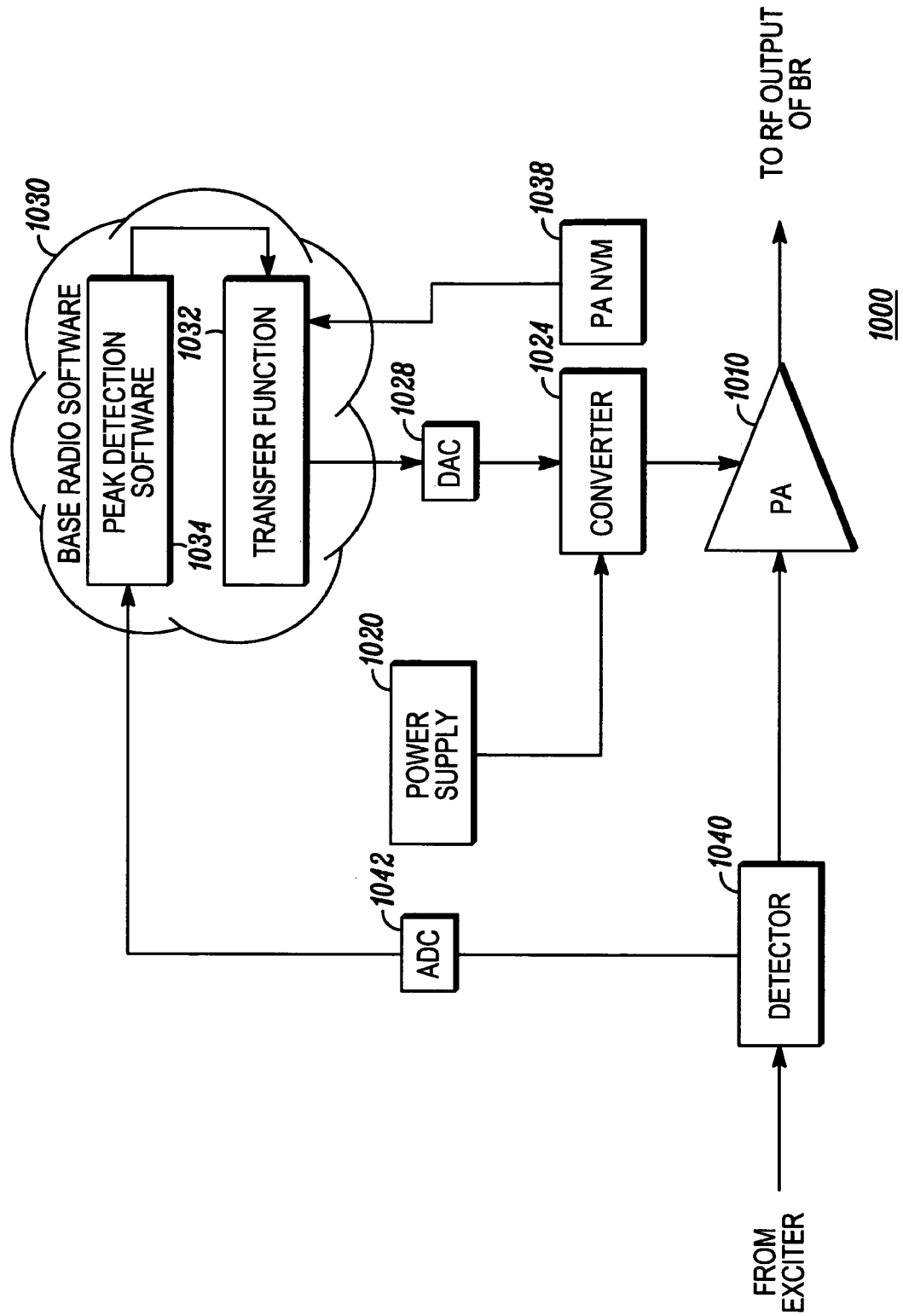
FIG. 10 illustrates a block diagram of apparatus in accordance with embodiments of the present invention.

The embodiment 1000 illustrated in FIG. 10 implements a form of feedback for adjusting the PA supply voltage. Embodiment 1000 comprises elements that are the same or similar to those in embodiment 600, the structure and functionality of which will not be repeated here for the sake of brevity. These elements include a RF PA 1010; a power supply 1020; a converter device 1024; a DAC 1028 a controller that may comprise one or more processors and memory for storing software 1030 for execution by the processor(s) for performing all or a portion of the controller functionality, wherein software 1030 may include platform software (having for example fault management software and a predetermined transfer function 1032), application software and digital signal processing firmware; a PA NVM 1038 that stores at least the peak power capability of the PA 1010 and at least one scalar for the PA; a fault sense circuit, and an ADC 1042 although not every one of these elements is illustrated in FIG. 10 for ease of illustration.

Moreover, this embodiment is shown having a single PA device for ease of illustration. However, the principles described by reference to FIG. 10 may be applied in an embodiment having different amplification lineups as described above. In an embodiment implementing a multi-stage PA, a supply voltage as determined using the predetermined transfer function may be provided to the final stage only of the PA or may also be provided to additional stages of the PA depending on the particular implementation. Moreover, where a supply voltage is applied to multiple stages of the PA, the same or different supply voltages may be provided to each stage, and a compensation circuit may be suitably implemented to adjust, for example, the phase and amplitude of the signal from the exciter to the first stage of the PA.

Embodiment 1000 further comprises a combination of a peak detection software 1034 included in the base radio software 1030 and a peak detector device 1040 that couples a portion of the RF signal received by the PA 1010 from the exciter in order to detect a peak amplitude of the signal. An exemplary peak detector device may comprise, for example, a directional coupler for sampling the signal from the exciter. The peak detector device 1040 may further comprise elements such as one or more diodes, capacitors and/or resistors, which are operatively coupled using techniques well known in the art, for converting the sampled signal into a voltage signal that is representative of the peak amplitudes of the RF signal being sampled. For instance, the detector device 1040 may comprise a rectifier diode coupled in series with the directional coupler to detect the amplitudes of the voltage signal sampled by the directional coupler and a capacitor and resistor in parallel with one another and in shunt to the diode for filtering the voltage signal to generate a DC voltage signal that is representative of the peak power output. The sizes of the capacitor and resistor are typically chosen such that the detector device has a relatively fast charging time and slow decay time.

The ADC 1042 then converts the analog voltage signal from the detector device 1040 into a digital word for providing to the peak detection software 1034. The peak detection software then determines the peak power at the output of the PA 1010 (e.g., $P_{Peak\ Req}$ (W)) based on this digital word. To determine a more accurate peak power output, the peak detection software can account for the gain of PA 1010 and the coupler response as a function of frequency. This can be performed using a lookup table in one embodiment. Those skilled in the art will realize that in another embodiment, the detector device 1040 and ADC 1042 may be coupled to the output of the PA 1010 and in such an embodiment, the peak detection software 1034 would not have to factor in the gain of the PA when determining the peak output power of the PA but can simply factor in the coupler response as based on frequency. Moreover, the peak detection software may implement a sampling frequency for receiving the digital word that takes into consideration the processing power available and the size of the capacitor in the detector device.

In accordance with embodiment 1000, a modified equation (5) may serve as the transfer function to determine the PA supply voltage $V_1$, since $P_{Peak\ Req}$ (W) is measured using the peak detector device 1040 and the peak detection software 1034 instead of being calculated based on the inputs $P_{peak\ to\ Average\ Ratio}$ (dB) and $P_{Avg}$ (dB) into the transfer function. The equation for transfer function 1034 then becomes:

$$V_1 = (P_{Peak\ Req}(W)/P_{Cap}(W))^{1/2} * V_2 * S * S_M, \qquad (9)$$

wherein as stated above $P_{Peak\ Req}$ (W) is measured and wherein similarly to the embodiment 600 described above, the inputs $P_{Peak\ Cap}$, S and $S_M$ may be obtained from the PA NVM.

Figure 11:
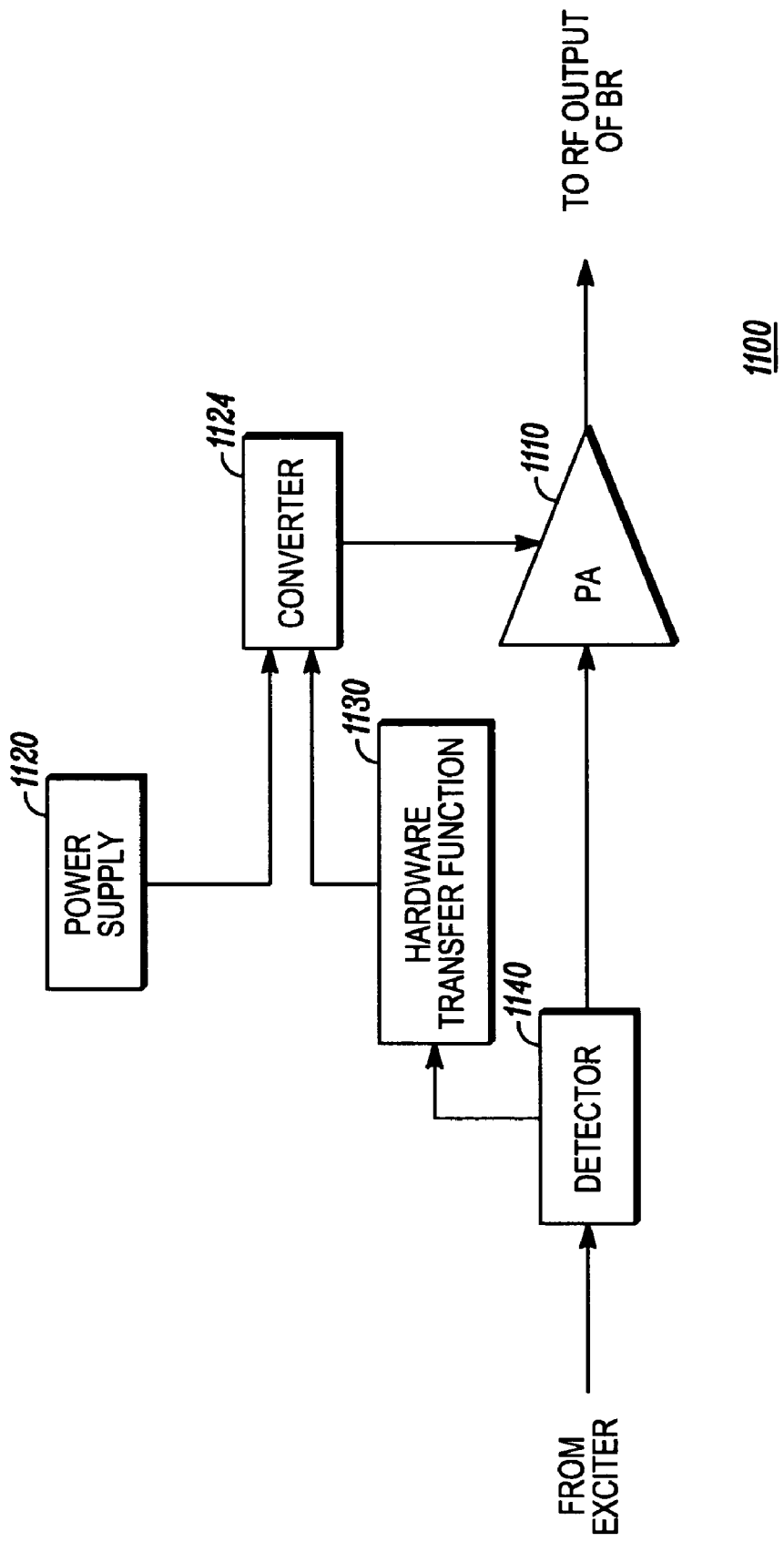
FIG. 11 illustrates a block diagram of apparatus in accordance with embodiments of the present invention.

The embodiment 1100 illustrated in FIG. 11 is similar to embodiment 1000 described above in that the peak amplitude of the detected RF input signal into the PA may be measured and the PA supply voltage determined based on the measured peak amplitude. Accordingly, embodiment 1100 comprises elements that are the same or similar to those in embodiments 1000, the structure and functionality of which will not be repeated here for the sake of brevity. These elements include a RF PA 1110; a power supply 1120; a converter device 1124; a controller that may comprise a processor and memory for storing software, wherein the software may include platform software (having for example fault management software), application software and digital signal processing firmware; a fault sense circuit, and a detector circuit 1140 although not every one of these elements is illustrated in FIG. 11 for ease of illustration.

However, in contrast to embodiment 1000, embodiment 1100 comprises a transfer function 1130 implemented in hardware instead of software. In one embodiment, the transfer function comprises a gain of an amplification network comprising at least one amplifier that receives the analog voltage from the detector device 1140 and converts it into the PA supply voltage or a scaled version thereof for providing to the converter device 1124. Those skilled in the art will realize that for a more accurate determination of the PA supply voltage, the amplification network will factor in the gain of the PA (when the detector device is coupled to the input of the PA 1110) and the coupler response (of the detector device 1140) based on the frequency of the sampled RF signal.

Moreover, this embodiment is shown having a single PA device for ease of illustration. However, the principles described by reference to FIG. 11 may be applied in an embodiment having a different amplification network as described above. In an embodiment implementing a multi-stage PA, a supply voltage as determined using the predetermined transfer function may be provided to the final stage only of the PA or may also be provided to additional stages of the PA depending on the particular implementation. Moreover, where a supply voltage is applied to multiple stages of the PA, the same or different supply voltages may be provided to each stage, and a compensation circuit may be suitably implemented to adjust, for example, the phase and amplitude of the signal from the exciter to the first stage of the PA.

Figure 12:
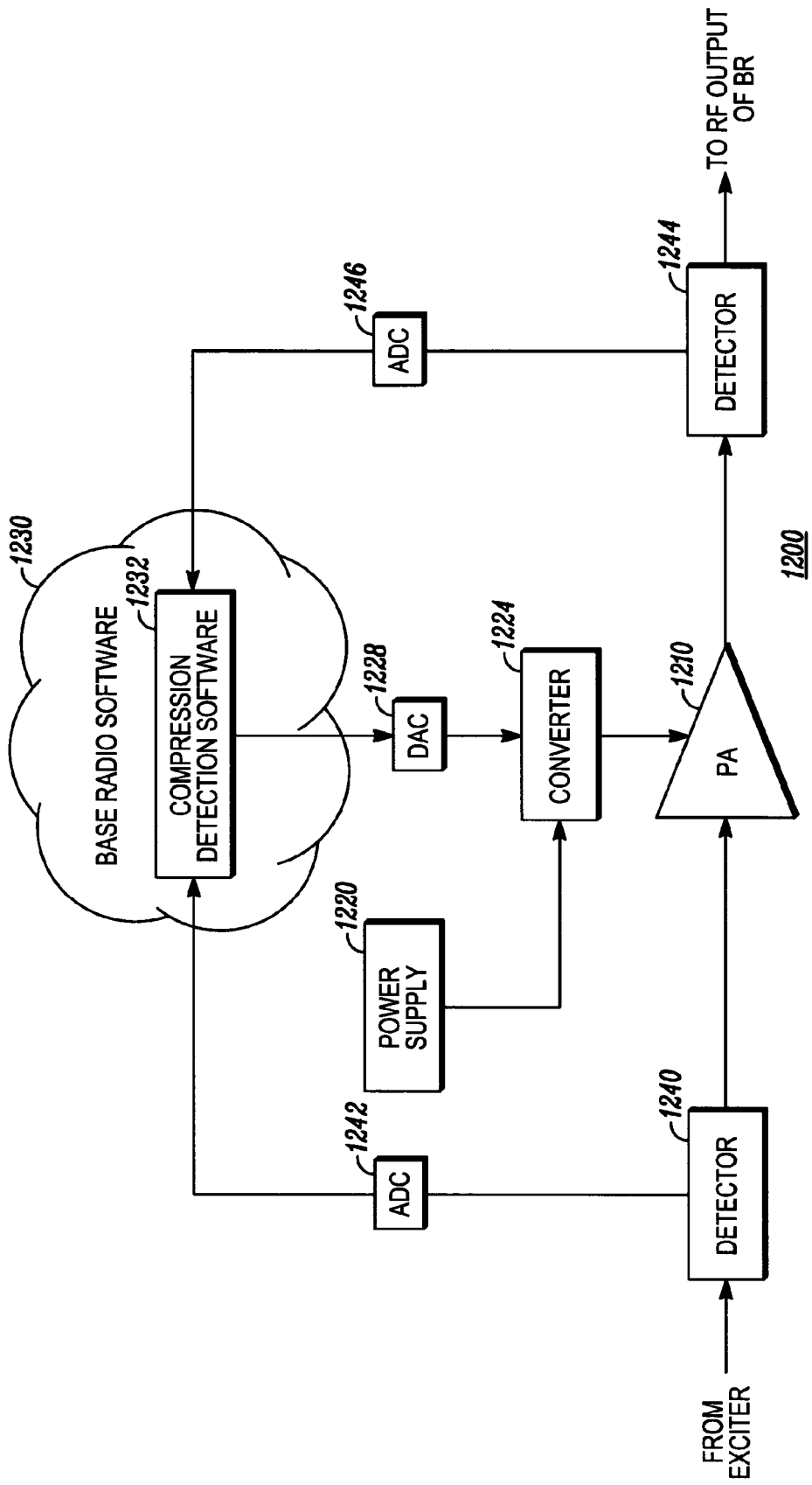
FIG. 12 illustrates a block diagram of apparatus in accordance with embodiments of the present invention.

The embodiment 1200 illustrated in FIG. 12 also implements a form of feedback for adjusting the PA supply voltage. However, the feedback is for detecting a compression level of a PA, for instance, as indicated by the level of compression of a signal transmitted by the PA. Embodiment 1200 comprises elements that are the same or similar to those in embodiment 600, the structure and functionality of which will not be repeated here for the sake of brevity. These elements include a RF PA 1210; a power supply 1220; a converter device 1224; a DAC 1228; a controller that may comprise one or more processors and memory for storing software 1230 for execution by the processor(s) for performing all or a portion of the controller functionality, wherein software 1230 may include platform software (having for example fault management software), application software and digital signal processing firmware; a PA NVM; a fault sense circuit; and an ADC 1242, although not every one of these elements is illustrated in FIG. 12 for ease of illustration.

Moreover, this embodiment is shown having a single PA device for ease of illustration. However, the principles described by reference to FIG. 12 may be applied in an embodiment having different amplification lineups as described above. In an embodiment implementing a multi-stage PA, a supply voltage as determined using the embodiments described herein may be provided to the final stage only of the PA or may also be provided to additional stages of the PA depending on the particular implementation. Moreover, where a supply voltage is applied to multiple stages of the PA, the same or different supply voltages may be provided to each stage, and a compensation circuit may be suitably implemented to adjust, for example, the phase and amplitude of the signal from the exciter to the first stage of the PA.

Embodiment 1200 further comprises a combination of compression detection software 1232 included in the base radio software 1230, detector devices 1240, 1244 coupled respectively to the input and output of PA 1210 and an ADC 1246. Each detector device may comprise, for example, a directional coupler for sampling the RF signal (at the input or output of the PA 1210) and one or more diodes for detecting the sampled signal. The detectors may or may not include additional capacitors and/or resistors, etc., coupled to the one or more diodes for filtering the detected signal. The detectors are ideally constructed so as to have a fast rise and decay time so that various points on the RF signal envelop may be sampled.

Figure 13:
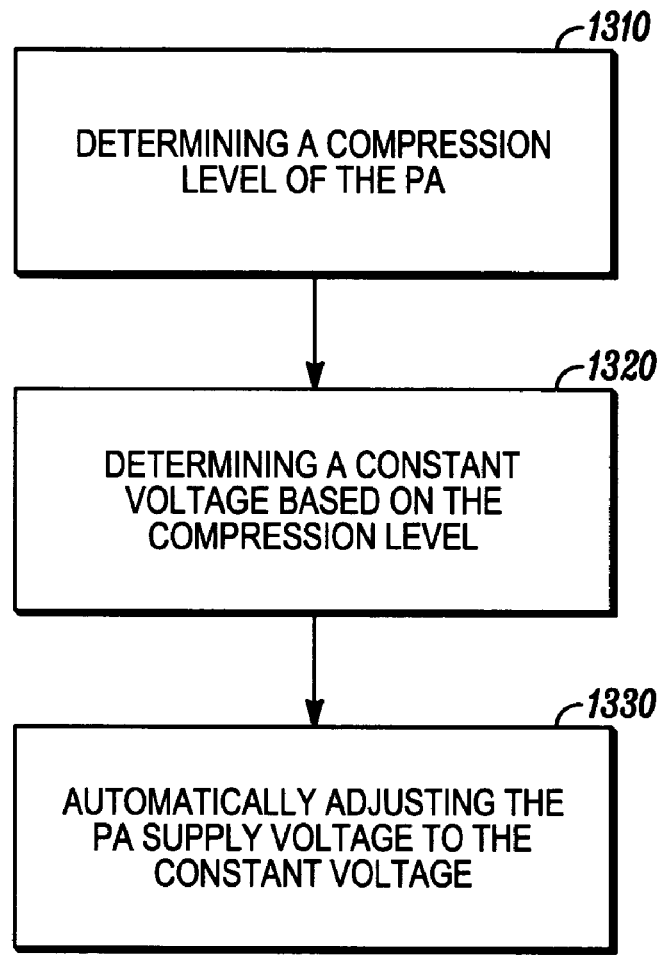
FIG. 13 illustrates a flow diagram of a method for adjusting the supply voltage of a power amplifier in accordance with embodiments of the present invention.

FIG. 13 illustrates a flow diagram of a method that may be implemented in apparatus 1200 for determining the supply voltage that converter 1224 supplies to PA 1210. Detectors 1240 and 1244 sample, respectively, the RF signal at the input and output of PA 1210. The ADCs 1242, 1246 convert these analog samples into corresponding digital words that are provided to the compression detection software 1232. From these digital words, the compression detection software may determine: (1310) a compression level of the PA; and (1320) a constant PA supply voltage based on the compression level. The compression detection software 1232 may perform steps 1310 and 1320 as follows.

With all or typically a portion of the samples provided by the detectors via the ADCs, the compression detection software may determine an average power value (APV) and a peak power value (PPV) at the input and the output of the PA. With the APVs and the PPVs, the compression detection software may determine a PAR at both the input and the output of the PA by subtracting the respective APVs from the PPVs. The difference between the input PAR and the output PAR is indicative of the compression level of the PA. The compression detection software may then compare the difference in the PARs to a compression threshold to determine whether the PA supply voltage should be adjusted. The compression threshold may indicate a level of compression in the PA that would cause spectral non-compliance of apparatus 1200. Thus, where the difference in the PARs is greater than the compression threshold, the compression detection software may determine a higher constant PA supply voltage to give the PA additional headroom in which to operate. The compression detection software could then communicate a representation of this determined constant PA supply voltage (or a scaled version thereof) to the converter device for adjusting (1330) the PA supply voltage to the constant voltage.

Figure 14:
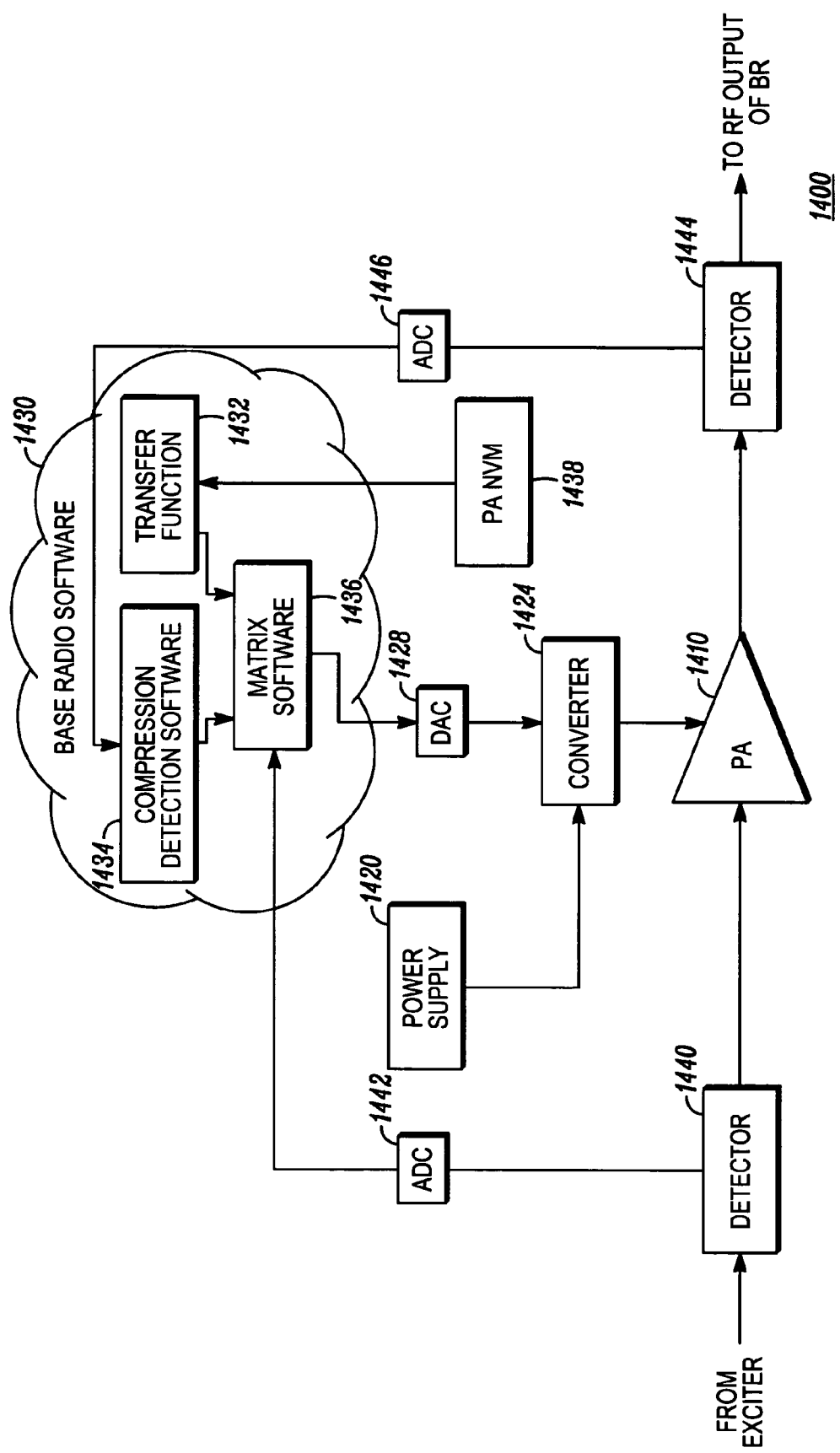
FIG. 14 illustrates a block diagram of apparatus in accordance with embodiments of the present invention.

Embodiment 1400 illustrated in FIG. 14 is a combination of embodiments 600 and 1200 described above, thereby, using a combination of a transfer function and compression detection software and corresponding detectors to determine the constant PA supply voltage. Accordingly, embodiment 1400 comprises elements that are the same or similar to those in embodiments 600 and 1200, the structure and functionality of which will not be repeated here for the sake of brevity. These elements include a RF PA 1410; a power supply 1420; a converter device 1424; a DAC 1428; a controller that may comprise one or more processors and memory for storing software 1430 for execution by the processor(s) for performing all or a portion of the controller functionality, wherein software 1430 may include platform software (having for example fault management software, a transfer function 1432 and compression detection software 1434), application software and digital signal processing firmware; a PA NVM 1438; a fault sense circuit; ADCs 1442 and 1446; and detectors 1440 and 1444, although not every one of these elements is illustrated in FIG. 14 for ease of illustration.

Moreover, this embodiment is shown having a single PA device for ease of illustration. However, the principles described by reference to FIG. 14 may be applied in an embodiment having different amplification lineups as described above. In an embodiment implementing a multi-stage PA, a supply voltage as determined using the embodiments described herein may be provided to the final stage only of the PA or may also be provided to additional stages of the PA depending on the particular implementation. Moreover, where a supply voltage is applied to multiple stages of the PA, the same or different supply voltages may be provided to each stage, and a compensation circuit may be suitably implemented to adjust, for example, the phase and amplitude of the signal from the exciter to the first stage of the PA.

Embodiment 1400 further comprises matrix software 1436 for determining whether the transfer function 1432 or the compression detection 1434 should be used to determine the PA supply voltage. For example, in one embodiment the matrix software may determine that the transfer function 1432 should initially be used to determine an initial course constant PA supply voltage (e.g., upon power-up of the apparatus 1400, upon switching to a different modulation scheme, etc.) and then when the compression detection software 1434 has enough samples based upon its particular implementation, the matrix software 1436 may determine that the compression detection software 1434 should be used to fine tune the PA supply voltage to a second constant voltage.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

What is claimed is:

1. A method for controlling a supply voltage for a radio frequency power amplifier (PA), comprising the steps of:
    determining a power ratio, wherein the power ratio is a percentage utilization of a peak power capability of the PA;
    determining a constant voltage based on the power ratio using a predetermined function; and
    automatically adjusting the supply voltage to the constant voltage.

2. The method of claim 1 further comprising the steps of:
    receiving an indication of a fault in the PA;
    determining a second constant voltage based on the indication of a fault; and
    automatically adjusting the supply voltage to the second constant voltage.

3. The method of claim 1, wherein the predetermined function comprises a scalar that is modulation independent for adjusting the supply voltage.

4. The method of claim 1, wherein the predetermined function comprises a scalar that is modulation dependent for adjusting the supply voltage.

5. The method of claim 1, wherein the power ratio is determined without using feedback from the PA.

6. The method of claim 1, wherein the power ratio is determined by using feedback from the PA.

7. The method of claim 1, wherein the predetermined function is implemented in one of software and hardware.

8. The method of claim 1, wherein the predetermined function is $V_1 = (P_R)^{1/2} * V_2$, where $V_1$ is the constant voltage, $V_2$ is an input voltage and $P_R$ is the power ratio.

9. Apparatus comprising:
    transceiver apparatus comprising a radio frequency power amplifier (PA);
    a converter device; and
    a controller that controls the converter device to generate and provide a supply voltage to the PA, the controller executing the steps of:
        determining a power ratio, wherein the power ratio is a percentage utilization of a peak power capability of the PA;
        determining a constant voltage based on the power ratio using a predetermined function; and
        automatically adjusting the supply voltage to the constant voltage.

10. The apparatus of claim 9, wherein the converter device comprises one of a buck converter, a boost converter and a flyback converter.

11. The apparatus of claim 9, wherein the PA is one of a linear PA and a non-linear PA.

12. The apparatus of claim 9 wherein the PA is a multi-stage PA.

13. The apparatus of claim 12, wherein the supply voltage is provided to at least a final stage of the PA.

14. The apparatus of claim 13 farther comprising a compensation circuit that adjusts at least one of a phase and an amplitude of an input signal into the PA using an input from one of the controller and the converter device.

15. The apparatus of claim 9 farther comprising:
    a detector circuit for detecting a RF signal at one of an input and an output of the power amplifier for sampling the RF signal and detecting a peak amplitude of the RF signal, wherein the controller further executes the step of determining the power ratio based on the detected peak amplitude.

16. The apparatus of claim 9, wherein the apparatus comprises a base radio.

17. A method for controlling a supply voltage for a radio frequency power amplifier (PA), comprising the steps of:
    determining at least one parameter comprising at least a compression level of the PA;
    determining a constant voltage based on the at least one parameter; and
    automatically adjusting the supply voltage to the constant voltage.

18. The method of claim 17, wherein the at least one parameter further comprises a power ratio, wherein the power ratio is a percentage utilization of a peak power capability of the PA.

19. The method of claim 18, further comprising the steps of:
    determining an initial constant voltage based on the power ratio using a predetermined function;
    automatically adjusting the supply voltage to the initial voltage;
    determining a subsequent constant voltage based on the compression level of the PA; and
    automatically adjusting the supply voltage to the subsequent constant voltage.

* * * * *